(12) United States Patent
Kim

(10) Patent No.: US 7,435,615 B2
(45) Date of Patent: Oct. 14, 2008

(54) METHOD FOR FABRICATING CMOS IMAGE SENSOR

(75) Inventor: Su Kon Kim, Choongcheongbukdo (KR)

(73) Assignee: Dongbu Electronics Co., Ltd., Seoul (KR)

( * ) Notice: Subject to any disclaimer, the term of this patent is extended or adjusted under 35 U.S.C. 154(b) by 334 days.

(21) Appl. No.: 11/184,289

(22) Filed: Jul. 18, 2005

(65) Prior Publication Data

US 2006/0019425 A1 Jan. 26, 2006

(30) Foreign Application Priority Data

Jul. 20, 2004 (KR) ............... 10-2004-0056370

(51) Int. Cl.
*H01L 21/00* (2006.01)

(52) U.S. Cl. ............... 438/70; 438/69; 438/71; 438/72; 257/E31.127; 257/E27.133

(58) Field of Classification Search ......... 257/E31.127, 257/E27.133; 438/69–72
See application file for complete search history.

(56) References Cited

U.S. PATENT DOCUMENTS

| | | | |
|---|---|---|---|
| 5,672,519 A * | 9/1997 | Song et al. | 438/69 |
| 5,841,126 A | 11/1998 | Fossum et al. | |
| 5,886,659 A | 3/1999 | Pain et al. | |
| 5,990,506 A | 11/1999 | Fossum et al. | |
| 6,005,619 A | 12/1999 | Fossum | |
| 6,021,172 A | 2/2000 | Fossum et al. | |
| 6,344,369 B1 * | 2/2002 | Huang et al. | 438/70 |
| 6,369,417 B1 * | 4/2002 | Lee | 257/294 |
| 6,582,988 B1 * | 6/2003 | Hsiao et al. | 438/70 |
| 6,617,189 B1 * | 9/2003 | Chen et al. | 438/48 |

(Continued)

FOREIGN PATENT DOCUMENTS

KR 10-0214486 5/1999

OTHER PUBLICATIONS

Seong Hwan Park: Method for Manufacturing Charge Coupled Device: Published Date May 20, 1999; 2 Pgs.: Korean Patent Abstracts; Publication No. 100214486 B1: Korean Intellectual Property Office, Republic of Korea.

(Continued)

*Primary Examiner*—Eugene Lee
*Assistant Examiner*—Peniel M Gumedzoe
(74) *Attorney, Agent, or Firm*—Andrew D. Fortney

(57) ABSTRACT

A method for fabricating a CMOS image sensor improves the characteristics of device by preventing a pad from being contaminated without damaging a micro-lens. The method includes steps of forming a device protection layer on a semiconductor substrate including at least one photo-sensing device and at least one metal pad disposed in a logic circuit area corresponding to the at least one photo-sensing device, the device protection layer covering the at least one metal pad; forming each of a first planarization layer, a color filter layer, and a second planarization layer in sequence on the device protection layer in correspondence with the at least one photo-sensing device; forming on the second planarization layer a material layer for micro-lens formation; exposing a predetermined portion of the metal pad by selectively etching the device protection layer; and forming a micro-lens for directing incident light onto the at least one photo-sensing device by reflowing, after the exposing step, the material layer for micro-lens formation.

20 Claims, 3 Drawing Sheets

U.S. PATENT DOCUMENTS

| | | | |
|---|---|---|---|
| 6,632,700 B1* | 10/2003 | Fan et al. | 438/70 |
| 7,019,373 B2* | 3/2006 | Hashimoto | 257/432 |
| 2004/0147105 A1* | 7/2004 | Chang et al. | 438/612 |
| 2005/0101043 A1* | 5/2005 | Chen et al. | 438/30 |
| 2005/0269656 A1* | 12/2005 | Shian-Ching et al. | 257/440 |
| 2006/0046341 A1* | 3/2006 | Joon | 438/70 |

OTHER PUBLICATIONS

Office Action, Korean Patent Application No. 10-2004-0056370, Dated Aug. 3, 2006.

* cited by examiner

METHOD FOR FABRICATING CMOS IMAGE SENSOR

CROSS-REFERENCE TO RELATED APPLICATIONS

This application claims the benefit of Korean Application No. 10-2004-0056370 filed on Jul. 20, 2004, which is hereby incorporated by reference as if fully set forth herein.

BACKGROUND OF THE INVENTION

1. Field of the Invention

The present invention relates to an image sensor, and more particularly, to a method for fabricating a CMOS image sensor, which improves device characteristics by preventing contamination of a metal pad without causing damage to a micro-lens.

2. Discussion of the Related Art

A complementary metal-oxide-semiconductor (CMOS) image sensor, which may be comprised of an array of photodiodes as the photo-sensing means and includes a CMOS logic circuit for each photodiode, is essentially a semiconductor device for generating an optical image based on incident light signals. In such a CMOS image sensor, wherein each photodiode senses incident light and the corresponding CMOS logic circuit converts the sensed light into an electrical signal, the photodiode's photosensitivity increases as more light is able to reach the photodiode. One way of enhancing a CMOS image sensor's photosensitivity is to improve its "fill factor," i.e., the degree of surface area occupied by the photodiodes versus the entire surface area of the image sensor, whereby the fill factor is improved by increasing the area responsive to incident light. For example, a device exhibiting excellent light transmittance, such as a convex micro-lens for refracting incident light, may be provided to redirect any light that may be incident to the image sensor outside the immediate area of the photodiodes and to concentrate (focus) the incident light on one or more of the photodiodes themselves.

In fabricating a general CMOS image sensor, a metal pad is disposed in a logic circuit area, adjacent a photo-sensing device (e.g., photodiode) area, and then a device protection layer, which may have a deposition structure of an undoped silicate glass (USG) layer and a silicon nitride (SiN) layer, is formed to protect the device from moisture and abrasion. To enable a wire bonding in the packaging process of the CMOS image sensor, a predetermined portion of the metal pad is exposed, for example, by etching the device protection layer. Meanwhile, the photo-sensing device area is provided with a color filter array and a micro-lens.

A general CMOS image sensor is illustrated in FIG. 1, showing the photo-sensing device area as an area A and the logic circuit area, including the metal pad, as an area B. Accordingly, at least one photo-sensing device and a corresponding logic circuit are formed on a semiconductor substrate 1 including an insulating layer 2, and a metal pad 4 of, for example, aluminum or copper is disposed on the insulating layer. Conductivity with respect to each interface of the metal pad 4 may be improved by providing first and second barrier layers 3 and 5 of titanium or titanium nitride, which are formed next to the metal pad's lower and upper surfaces, respectively, using a chemical mechanical polishing process. A device protection layer 6 for protecting the device from moisture and abrasion is formed over the resulting structure, and a metal pad opening C providing a surface for the wire bond is formed by selectively etching the device protection layer to expose a predetermined portion of the metal pad 4. A first planarization layer 7 is formed on the device protection layer 6 to coincide with the photo-sensing device area (A). Also in correspondence with the area A is a second planarization layer 9 formed atop a color filter array 8, which is formed by an exposure and patterning of a color photoresist deposited on the first planarization layer 7, thus producing a filter array transmitting red, green, and blue light.

A micro-lens 100 is provided on the second planarization layer 9. In the formation of the micro-lens 100, a material layer is deposited on the second planarization layer 9 and is selectively patterned. The patterned material layer undergoes a reflow process for the formation of a smooth, convex upper surface.

According to a contemporary CMOS image sensor fabrication method, however, the color filter formation, planarization, and micro-lens formation processes generate a variety of residues that remain on the surface of the exposed metal pad, whereby the metal pad becomes contaminated and thus experiences corrosion due to the alkaline properties of the residue. When a wire bonding process is subsequently performed with respect to the metal pad, such damage of the exposed metal pad is likely to result in an unreliable electrical contact, thereby lowering yield. Although the color filter formation, planarization steps, and micro-lens formation may be performed while the device protection layer remains intact, if the metal pad opening were to be formed after micro-lens formation, the surface of the micro-lens is damaged during the etching of the device protection layer. A damaged lens surface causes uncontrollable light diffusion in the micro-lens and can destroy its light-focusing properties, which severely degrades picture quality.

SUMMARY OF THE INVENTION

Accordingly, the present invention is directed to a method for fabricating a CMOS image sensor that substantially obviates one or more problems due to limitations and disadvantages of the related art.

An object of the present invention is to provide a method for fabricating a CMOS image sensor, which improves device characteristics by preventing contamination of a metal pad without causing damage to a micro-lens.

Another object of the present invention is to provide a method for fabricating a CMOS image sensor, which enables formation of a reliable electrical contact when performing a wire bonding with respect to a metal pad.

Another object of the present invention is to provide a method for fabricating a CMOS image sensor, which increases yield.

Another object of the present invention is to provide a method for fabricating a CMOS image sensor, which maintains the optical qualities of the image sensor.

Another object of the present invention is to provide a method for fabricating a CMOS image sensor, which enables a minimization of incidental damage to a material layer for micro-lens formation.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages in accordance with the purpose of the invention, as embodied and broadly described herein, there is provided a method for fabricating a CMOS image sensor, comprising forming a device protection layer on a semiconductor substrate including at least one photo-sensing device and at least one metal pad disposed in a logic circuit area corresponding to the at least one photo-sensing device, the device protection layer covering the at least one metal pad; forming each of a first planarization layer, a color filter layer, and a second planarization layer in sequence on the device protection layer in correspondence with the at least one photo-sensing device; forming on the second planarization layer a material layer for micro-lens formation; exposing a predetermined portion of the metal pad by selectively etching the device protection layer; and forming a micro-lens for directing incident light onto the at least one photo-sensing device by reflowing, after the exposing, the material layer for micro-lens formation.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. Wherever possible, like reference numbers will be used throughout the drawings to refer to the same or similar parts.

In the method for fabricating a CMOS image sensor according to the present invention, the step for forming an opening over a metal pad by a selective removal (etching) of a device protection layer covering the metal pad is performed after the step for depositing and patterning a material layer for formation of a micro-lens to be disposed over the photo-sensing device area. Yet, the reflow process is performed after the metal pad opening process, that is, in a state where the metal pad opening exists in the device protection layer. The CMOS image sensor fabrication method according to the present invention is illustrated in FIGS. 2A-2D, showing a photo-sensing device A and an adjacently disposed logic circuit area B.

Figure 1:
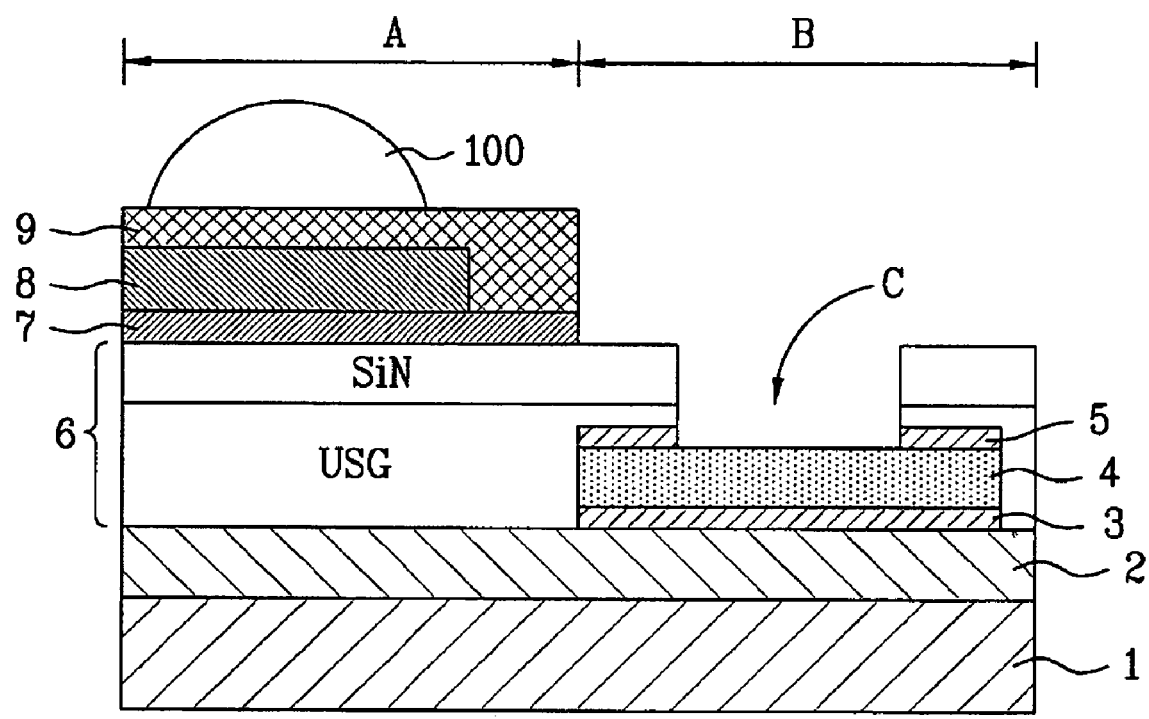
FIG. 1 is a cross-sectional view of a general CMOS image sensor.
Figure 2A:
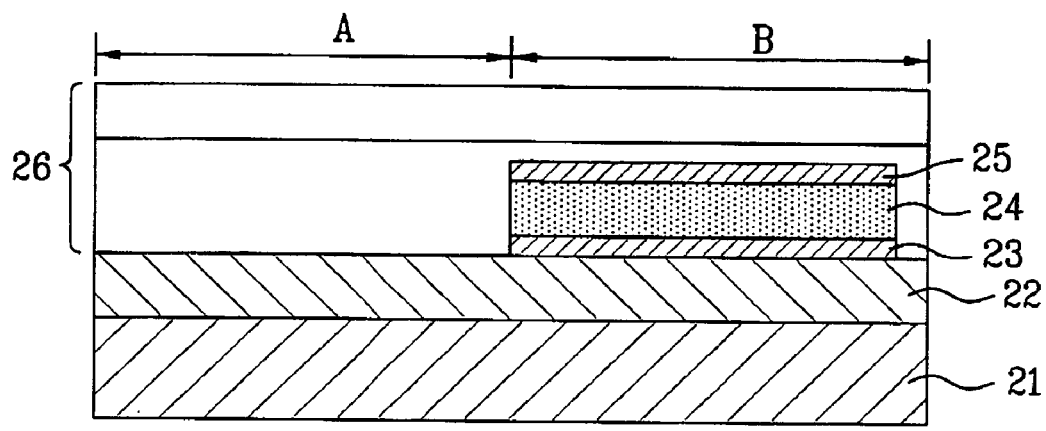
FIGS. 2A-2D are cross-sectional views illustrating a process for fabricating a CMOS image sensor according to the present invention.

As shown in FIG. 2A, at least one photo-sensing device and a corresponding logic circuit are formed on a semiconductor substrate 21, and an insulating layer 22 is formed on the semiconductor substrate. Then, a metal pad 24 of, for example, aluminum or copper is formed on the insulating layer 22. To improve conductivity with respect to each interface of the metal pad 24, first and second barrier layers 23 and 25 of titanium or titanium nitride are formed next to the metal pad's lower and upper surfaces, respectively, using a chemical mechanical polishing process. Thereafter, a device protection layer 26 for protecting the device from moisture and abrasion is formed over the resulting structure. According to a preferred embodiment, the device protection layer 26 has a deposition structure of an undoped silicate glass (USG) layer formed on the metal pad 24 and a silicon nitride (SiN) layer formed on the undoped silicate glass layer.

Figure 2B:
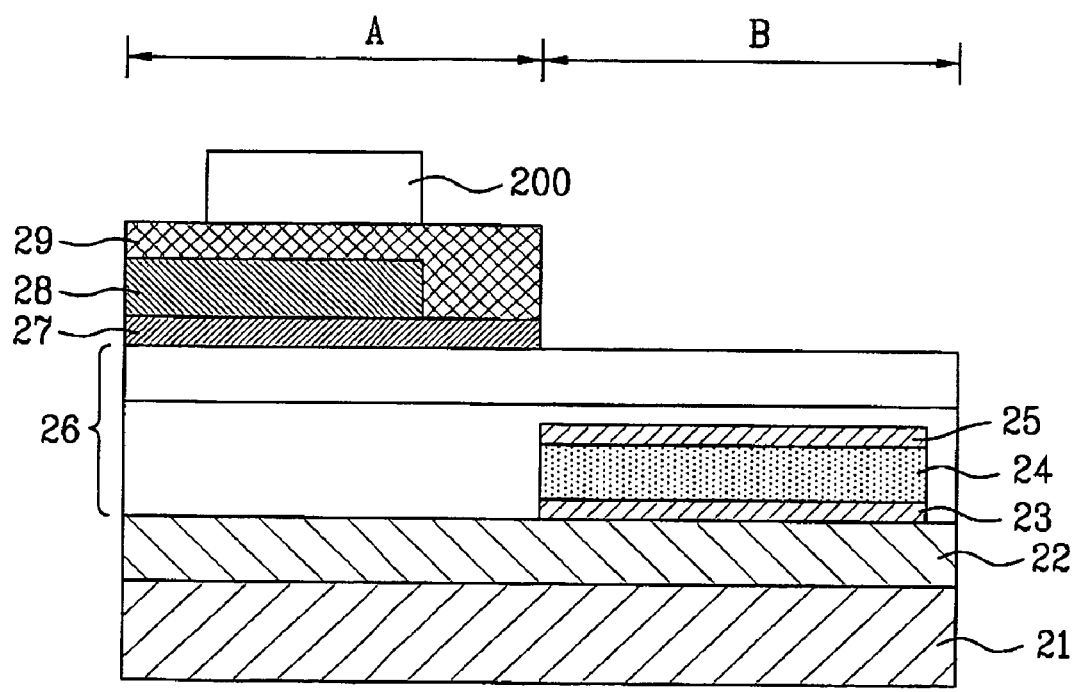

Referring to FIG. 2B, a first planarization layer 27 is formed on the device protection layer 26 to coincide with the photo-sensing device area A and to improve its topology and adhesion characteristics. A color filter array 28 is formed by coating the first planarization layer 27 with a color photoresist (not shown) that is patterned by exposure and development. A second planarization layer 29 is formed atop the color filter array 8, also in correspondence with the photo-sensing device area A, to provide a foundation for the formation of a micro-lens for directing incident light onto the photodiode of the photo-sensing area A. The micro-lens of the present invention is formed by first forming a micro-lens material layer 200 on the second planarization layer 9 by depositing on the second planarization layer a lens-forming material, which is patterned according to pixel size. At this time, the reflowing of the lens-forming material is deferred such that the surfaces of the micro-lens material layer 200 exhibit simple deposition characteristics with no convex shape for focusing light. Accordingly, the color filter formation, planarization steps, and micro-lens formation are completed while the device protection layer 26 remains intact, i.e., before exposing the metal pad 24 to form the metal pad opening C and to enable wire bonding.

Figure 2C:
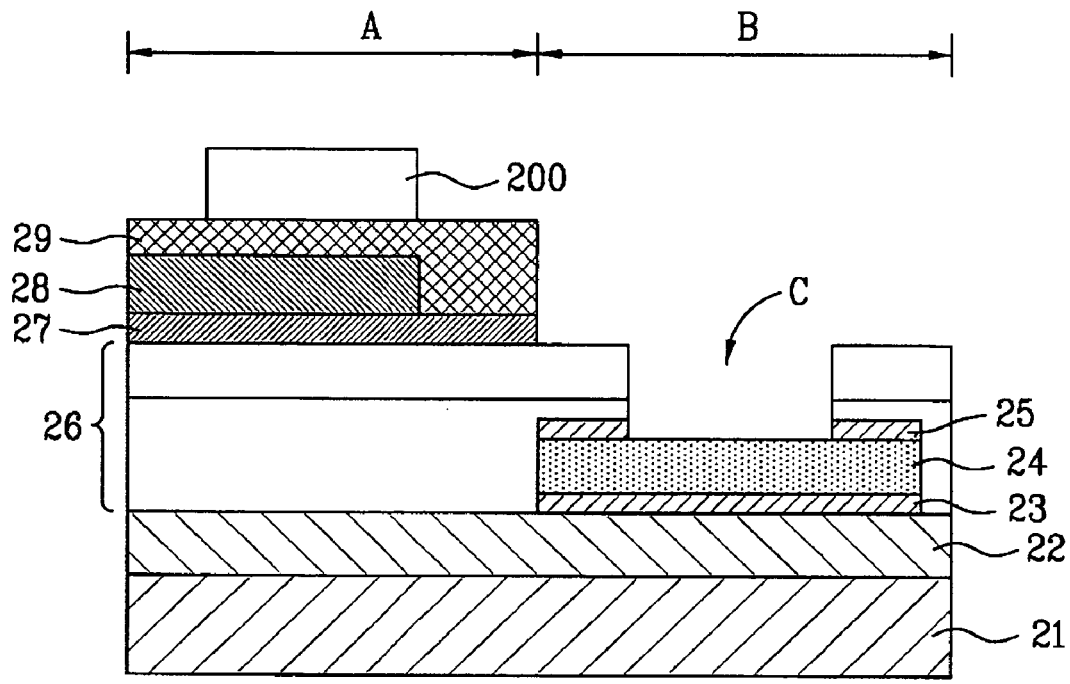

As shown in FIG. 2C, with the micro-lens material layer 200 thus formed on the second planarization layer 29, a metal pad opening C is formed by selectively etching the device protection layer 26 to expose a predetermined portion of the metal pad 24 to enable a wire bonding in the packaging process of the CMOS image sensor. Accordingly, the process for forming the metal pad opening C is completed while the micro-lens material layer 200 remains intact, i.e., before undergoing the reflow process to impart the micro-lens material layer with a smooth, convex upper surface for focusing incident light onto the photodiode.

Figure 2D:
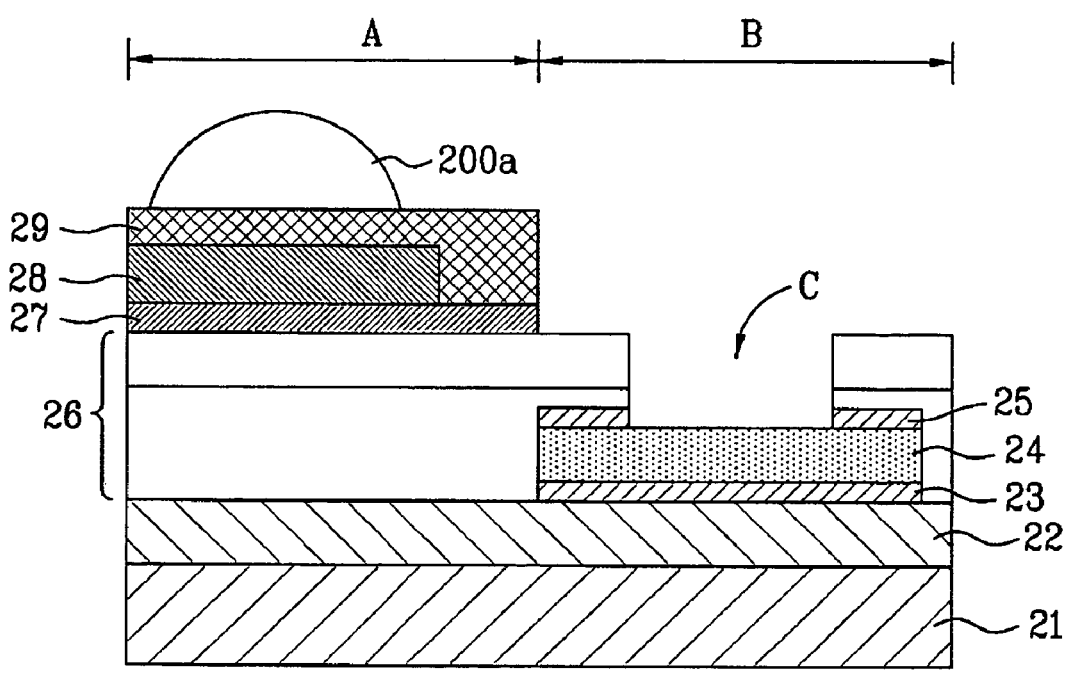

As shown in FIG. 2D, the reflow process is performed to form a micro-lens 200a. Thus, the convex upper surface of the micro-lens 200a is formed after performing the color filter formation, planarization, and micro-lens material layer patterning processes as well as after the process for forming the metal pad opening C.

In the method for fabricating a CMOS image sensor according to the present invention, the metal pad opening process is performed after patterning the material layer for the formation of the micro-lens, and the reflow process is performed after the metal pad opening process. As a result, it is possible to simultaneously prevent damage to either the metal pad or the micro-lens. Moreover, since completion of the micro-lens by reflowing is delayed until after color filter formation, planarization, micro-lens material layer patterning, and metal pad opening formation, it is possible to compensate for incidental damage to the material layer for micro-lens formation that may occur anytime throughout these processes, thereby optimizing conditions for obtaining preferred device characteristics.

As described above, the method for fabricating a CMOS image sensor according to the present invention enables the protection of the metal pad from adverse effects of the color filter formation, planarization, and micro-lens material layer patterning processes. After patterning the material layer for micro-lens formation, the metal pad opening process is performed, thereby enabling the prevention of damage to the metal pad. The reflow process is performed after the metal pad opening process, thereby simultaneously enabling the protection of the metal pad and the prevention of damage to the surface of the micro-lens. As a result, a CMOS image sensor fabricated by the method according to the present invention exhibits excellent picture quality and high yield.

It will be apparent to those skilled in the art that various modifications can be made in the present invention without departing from the spirit or scope of the invention. Thus, it is intended that the present invention covers such modifications provided they come within the scope of the appended claims and their equivalents.

What is claimed is:

1. A method for fabricating CMOS image sensor, comprising:
    forming a device protection layer on a semiconductor substrate including at least one photo-sensing device and at least one metal pad disposed in a logic circuit area corresponding to the at least one photo-sensing device, the device protection layer covering the at least one metal pad;
    forming each of a first planarization layer, a color filter layer, and a second planarization layer in sequence on the device protection layer in correspondence with the at least one photo-sensing device;
    forming on the second planarization layer a material layer for micro-lens formation while the device protection layer covers the at least one metal pad;
    exposing a predetermined portion of the metal pad by selectively etching the device protection layer, after forming the material layer; and
    forming a micro-lens for directing incident light onto the at least one photo-sensing device by reflowing, after said exposing the material layer for micro-lens formation.

2. The method of claim 1, wherein forming said material layer comprises:
    patterning the material layer for micro-lens formation according to a pixel size of the CMOS image sensor.

3. The method of claim 2, wherein said patterning is performed before said exposing.

4. The method of claim 1, wherein reflowing the material layer imparts the micro-lens with a convex upper surface for focusing incident light onto the at least one photo-sensing device.

5. The method of claim 1, wherein the device protection layer comprises an undoped silicate glass layer on the metal pad and a silicon nitride layer on the undoped silicate glass layer.

6. The method of claim 1, further comprising:
    forming first and second barrier layers for improving conductivity with respect to lower and upper surfaces of the metal pad, respectively.

7. The method of claim 6, wherein the first and second barrier layers comprise at least one of titanium and titanium nitride.

8. The method of claim 6, wherein forming the first and second barrier layers comprises chemical mechanical polishing.

9. The method of claim 1, wherein the predetermined portion of the metal pad corresponds to a surface of the metal pad for enabling a wire bonding with respect to the metal pad during a packaging process of the CMOS image sensor.

10. The method of claim 1, wherein the at least one photo-sensing device comprises a photodiode.

11. A method for fabricating a CMOS image sensor, comprising:
    forming a device protection layer on a semiconductor substrate including at least one photo-sensing device and at least one metal pad in a logic circuit area corresponding to the at least one photo-sensing device, the device protection layer covering the at least one metal pad;
    forming a first planarization layer, a color filter layer, and a second planarization layer in sequence on the device protection layer over the at least one photo-sensing device;
    forming a material layer on the second planarization layer while the device protection layer continues to cover the metal pad;
    after forming the material layer, exposing a predetermined portion of the metal pad by selectively etching the device protection layer; and
    reflowing the material layer to form a micro-lens.

12. The method of claim 11, said material layer forming comprising:
    patterning the material layer according to a pixel size of the CMOS image sensor.

13. The method of claim 11, further comprising bonding a wire to the metal pad.

14. The method of claim 11, wherein said micro-lens directs incident light onto the at least one photo-sensing device.

15. The method of claim 14, wherein said micro-lens has a convex upper surface.

16. The method of claim 12, wherein said material layer is patterned before said predetermined portion of said metal pad is exposed.

17. The method of claim 11, wherein said device protection layer comprises an undoped silicate glass layer on the metal pad.

18. The method of claim 17, wherein said device protection layer comprises a silicon nitride layer on the undoped silicate glass layer.

19. The method of claim 11, wherein forming the metal pad comprises forming a first barrier layer on an insulating layer, forming an aluminum or copper pad thereon, and forming a second barrier layer on the aluminum or copper pad.

20. The method of claim 19, wherein the first and second barrier layers comprise at least one of titanium and titanium nitride.

* * * * *